(12) United States Patent
Lee

(10) Patent No.: US 11,049,548 B1
(45) Date of Patent: Jun. 29, 2021

(54) MULTI-BANK TYPE SEMICONDUCTOR MEMORY DEVICE WITH REDUCED CURRENT CONSUMPTION IN DATA LINES

(71) Applicant: DOSILICON CO., LTD., Shanghai (CN)

(72) Inventor: Jun Keun Lee, Suwon-si (KR)

(73) Assignee: DOSILICON CO., LTD., Shanghai (CN)

( * ) Notice: Subject to any disclaimer, the term of this patent is extended or adjusted under 35 U.S.C. 154(b) by 0 days.

(21) Appl. No.: 16/991,603

(22) Filed: Aug. 12, 2020

(51) Int. Cl.
| | |
|---|---|
| *G11C 8/00* | (2006.01) |
| *G11C 11/408* | (2006.01) |
| *G11C 11/4091* | (2006.01) |
| *G11C 7/08* | (2006.01) |
| *G11C 7/10* | (2006.01) |

(52) U.S. Cl.
CPC ............ *G11C 11/4085* (2013.01); *G11C 7/08* (2013.01); *G11C 7/1048* (2013.01); *G11C 7/1096* (2013.01); *G11C 11/4091* (2013.01)

(58) Field of Classification Search
CPC ..... G11C 11/4085; G11C 7/08; G11C 7/1048; G11C 7/1096; G11C 7/4091
USPC .................................................... 365/230.06
See application file for complete search history.

(56) References Cited

U.S. PATENT DOCUMENTS

| | | | |
|---|---|---|---|
| 6,212,109 | B1 | 4/2001 | Proebsting |
| 7,639,550 | B2 | 12/2009 | Ha |
| 10,181,344 | B1 | 1/2019 | Venkata |
| 2003/0214344 | A1 | 11/2003 | Suwa et al. |
| 2007/0002669 | A1* | 1/2007 | Kodaira .................. G09G 3/20 365/230.06 |
| 2014/0133251 | A1* | 5/2014 | Takahashi .......... G11C 11/4094 365/189.16 |

* cited by examiner

*Primary Examiner* — Huan Hoang
(74) *Attorney, Agent, or Firm* — Kile Park Reed & Houtteman PLLC

(57) ABSTRACT

Disclosed herein is a multi-bank type semiconductor memory device which reduces current consumption of data lines. In the multi-bank type semiconductor memory device according to the present invention, the data lines between each memory bank and an input/output buffer are divided into horizontal data lines and vertical data lines. In addition, a high impedance driver is provided to drive horizontal local data of the horizontal data line to provide the horizontal local data as vertical local data of the vertical data line. Therefore, in the multi-bank type semiconductor memory device according to the present invention, even when the horizontal local data and the vertical local data are controlled at a low power voltage, degradation in overall operating speed hardly occurs. In addition, in the multi-bank type semiconductor memory device according to the present invention, current consumption in the data lines is significantly reduced.

4 Claims, 6 Drawing Sheets

US 11,049,548 B1

MULTI-BANK TYPE SEMICONDUCTOR MEMORY DEVICE WITH REDUCED CURRENT CONSUMPTION IN DATA LINES

BACKGROUND

1. Field of the Invention

The present invention relates to a multi-bank type semiconductor memory device, and more particularly, to a multi-bank type semiconductor memory device which allows current consumption in data lines to be reduced.

2. Discussion of Related Art

Generally, a semiconductor memory device is implemented in a multi-bank structure including a plurality of memory banks therein. In such a multi-bank type semiconductor memory device, while a data read operation is performed on one bank, a precharge operation required prior to a data read operation is performed on another bank. Thus, the multi-bank type semiconductor memory device has a great advantage in implementing high speed.

However, in the existing multi-bank type semiconductor memory device, data read from each memory bank is transmitted to an external device from a chip through the same data input/output line which is referred to as a "global data line."

Thus, in the existing multi-bank type semiconductor memory device, the data input/output line becomes long, and thus a large load is formed in the data input/output line. Such a large load acts as a factor limiting a data transmission speed.

Alternatively, in order to compensate for a decrease in the data transmission speed according to the large load, in the existing multi-bank type semiconductor memory device, even a high level power voltage may be used.

However, in this case, there occurs a problem in that current consumption in data lines of a semiconductor memory device becomes large.

SUMMARY OF THE INVENTION

The present invention is directed to a multi-bank type semiconductor memory device which allows current consumption in data lines to be reduced while maintaining an appropriate data transmission speed.

The present invention relates to a multi-bank type semiconductor memory device. According to an aspect of the present invention, there is provided a multi-bank type semiconductor memory device including a bank set having first, second, third, and fourth memory banks, each of which outputs bank data, wherein the second memory bank is disposed below the first memory bank, the third memory bank is disposed on a right side of the first memory bank, and the fourth memory bank is disposed below the third memory bank; a horizontal data line extending between the first memory bank and the second memory bank and between the third memory bank and the fourth memory bank in a lateral direction; a vertical data line extending between the first memory bank and the third memory bank and between the second memory bank and the fourth memory bank in a vertical direction; first, second, third, and fourth bank read amplifiers disposed to correspond to the first to fourth memory banks and configured to amplify pieces of bank data of the first to fourth memory banks to output pieces of read data according to selections of the first to fourth memory banks; a first read driver configured to drive the pieces of read data of the first bank read amplifier and the second bank read amplifier to provide the pieces of read data as pieces of horizontal local data of the horizontal data line according to the selection of the first memory bank and the second memory bank; a second read driver configured to drive the pieces of read data of the third bank read amplifier and the fourth bank read amplifier to provide the pieces of read data as the pieces of horizontal local data of the horizontal data line according to the selection of the third memory bank and the fourth memory bank; a high impedance driver configured to drive the horizontal local data to output the horizontal local data as vertical local data of the vertical data line according to the selection of one among the first to fourth memory banks; and a global amplifier configured to amplify the vertical local data to provide the amplified vertical local data as global data of a global data line, wherein the global data line is electrically connected to an input/output buffer. When pulling up, the bank data of each of the first to fourth memory banks and the global data is driven at a high power voltage, and when pulling up, the horizontal local data and the vertical local data is controlled at a low power voltage that is lower than the high power voltage.

BRIEF DESCRIPTION OF THE DRAWINGS

The above and other objects, features and advantages of the present invention will become more apparent to those skilled in the art by describing exemplary embodiments thereof in detail with reference to the accompanying drawings, in which.

DETAILED DESCRIPTION OF EXEMPLARY EMBODIMENTS

Figure 1:
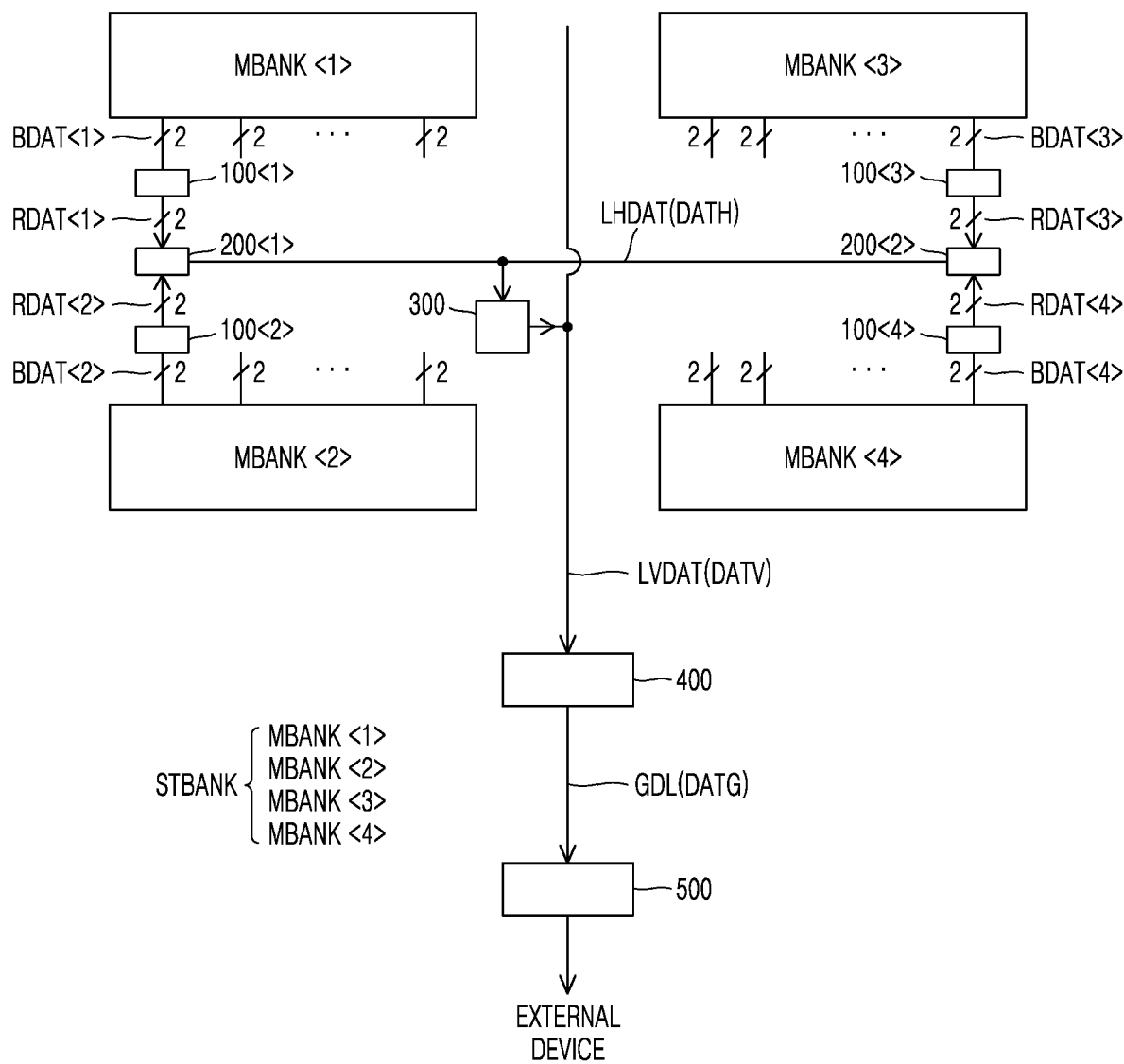
FIG. 1 is a diagram illustrating a multi-bank type semiconductor memory device according to one embodiment of the present invention.

FIG. 1 is a diagram illustrating a multi-bank type semiconductor memory device according to one embodiment of the present invention. It is noted that, in the semiconductor memory device of the present invention, when pulling up, data to be transmitted is pulled up at a high power voltage HVDD or a low power voltage LVDD according to a transmitted position. Here, the high power voltage HVDD is a relatively high level, and the low power voltage LVDD is a relatively low level.

Referring to FIG. 1, the semiconductor memory device of the present invention includes a bank set STBANK having first to fourth memory banks MBANK<1> to MBANK<4>. In this case, the first to fourth memory banks MBANK<1> to MBANK<4> are selected in a non-overlapping manner. In addition, each of the first to fourth memory banks MBANK<1> to MBANK<4> outputs bank data BDAT.

The first memory bank MBANK<1> outputs bank data BDAT<1> downward. The second memory bank MBANK<2> is disposed below the first memory bank MBANK<1> and outputs bank data BDAT<2> upward. The third memory bank MBANK<3> is disposed on a right side of the first memory bank MBANK<1> and outputs bank data BDAT<3> downward. In addition, the fourth memory bank MBANK<4> is disposed below the first memory bank MBANK<1> and outputs bank data BDAT<4> upward.

In this case, when pulling up, the pieces of bank data BDAT output from the first to fourth memory banks MBANK<1> to MBANK<4> are controlled at the high power voltage HVDD. Thus, data losses of the pieces of bank data BDAT due to a voltage drop are minimized.

For reference, in this disclosure, for simplicity of description, one bank set STBANK is typically shown and described. However, the number of bank sets STBANK may be increased to two or more.

In addition, the semiconductor memory device of the present invention further includes a horizontal data line LHDAT, a vertical data line LVDAT, first to fourth bank read amplifiers 100<1> to 100<4>, a first read driver 200<1>, a second read driver 200<2>, a high impedance 300, and a global amplifier 400.

In this disclosure, each of the horizontal data line LHDAT, the vertical data line LVDAT, the first to fourth bank read amplifiers 100<1> to 100<4>, the first read driver 200<1>, the second read driver 200<2>, the high impedance 300, the global amplifier 400, and an input/output buffer 500 is shown as one component. However, this is only for the sake of simplicity and clarity of description, and each of the above components is generally implemented as a plurality of components according to the number of pieces of data which are read at once from each memory bank MBANK.

For example, when each memory bank MBANK has a structure in which 128 pieces of data are read at once, each of the horizontal data line LHDAT, the vertical data line LVDAT, the first to fourth bank read amplifiers 100<1> to 100<4>, the first read driver 200<1>, the second read driver 200<2>, the high impedance 300, and the global amplifier 400 may be implemented as 128 components. In addition, when a burst length is eight, the input/output buffer 500 may be implemented as sixteen input/output buffers.

The horizontal data line LHDAT extends to be long between the first memory bank MBANK<1> and the second memory bank MBANK<2> and between the third memory bank MBANK<3> and the fourth memory bank MBANK<4> in a lateral direction.

The vertical data line LVDAT extends to be long between the first memory bank MBANK<1> and the third memory bank MBANK<3> and between the second memory bank MBANK<2> and the fourth memory bank MBANK<4> in a vertical direction.

The first to fourth bank read amplifiers 100<1> to 100<4> are disposed to correspond to the first to fourth memory banks MBANK<1> to MBANK<4>, respectively.

Specifically, the first bank read amplifier 100<1> is disposed to correspond to the first memory bank MBANK<1>. In addition, according to a selection of the first memory bank MBANK<1> corresponding to the first bank read amplifier 100<1>, the first bank read amplifier 100<1> amplifies the bank data BDAT<1> of the first memory bank MBANK<1> to output the amplified bank data BDAT<1> as read data RDAT<1>. Preferably, when pulling up, the read data RDAT<1> of the first memory bank MBANK<1> is controlled at the high power voltage HVDD.

The second bank read amplifier 100<2> is disposed to correspond to the second memory bank MBANK<2>. In addition, according to a selection of the second memory bank MBANK<2> corresponding to the second bank read amplifier 100<2>, the second bank read amplifier 100<2> amplifies the bank data BDAT<2> of the second memory bank MBANK<2> to output the amplified bank data BDAT<2> as read data RDAT<2>. Preferably, when pulling up, the read data RDAT<2> of the second memory bank MBANK<2> is controlled at the high power voltage HVDD.

The third bank read amplifier 100<3> is disposed to correspond to the third memory bank MBANK<3>. In addition, according to a selection of the third memory bank MBANK<3> corresponding to the third bank read amplifier 100<3>, the third bank read amplifier 100<3> amplifies the bank data BDAT<3> of the third memory bank MBANK<3> to output the amplified bank data BDAT<3> as read data RDAT<3>. Preferably, when pulling up, the read data RDAT<3> of the third memory bank MBANK<3> is controlled at the high power voltage HVDD.

In addition, the fourth bank read amplifier 100<4> is disposed to correspond to the fourth memory bank MBANK<4>. In addition, according to a selection of the fourth memory bank MBANK<4> corresponding to the fourth bank read amplifier 100<4>, the fourth bank read amplifier 100<4> amplifies the bank data BDAT<4> of the fourth memory bank MBANK<4> to output the amplified bank data BDAT<4> as read data RDAT<4>. Preferably, when pulling up, the read data RDAT<4> of the fourth memory bank MBANK<4> is controlled at the high power voltage HVDD.

Subsequently, configurations of the first to fourth bank read amplifiers 100<1> to 100<4> of FIG. 1 will be described in detail. In this case, the first to fourth bank read amplifiers 100<1> to 100<4> may be implemented in the same form.

Figure 2:
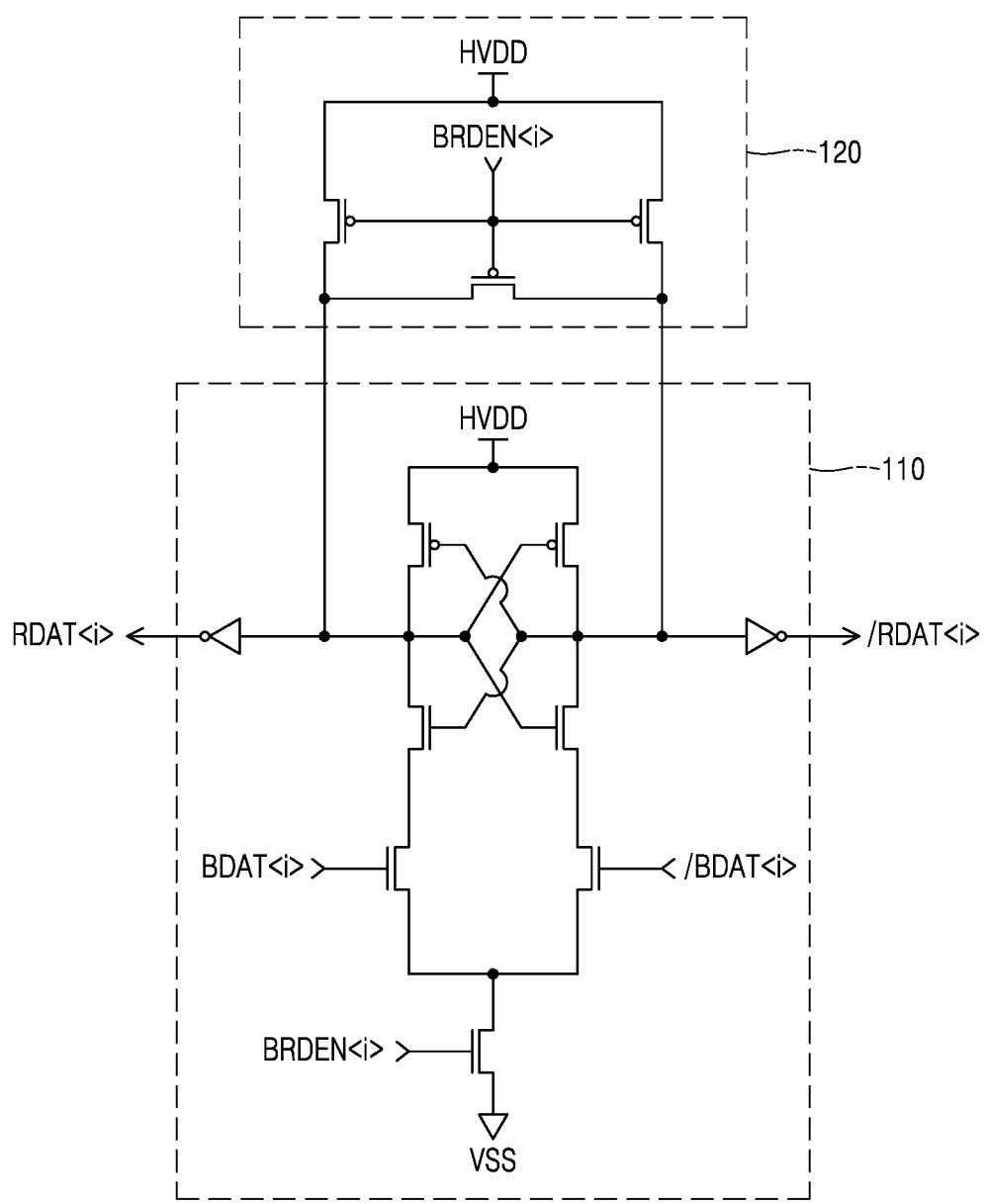
FIG. 2 is a diagram illustrating a bank read amplifier of FIG. 1.

FIG. 2 is a diagram illustrating a bank read amplifier 100<i> of FIG. 1 (here, i is a natural number that is greater than or equal to 1 and less than or equal to 4).

Referring to FIG. 2, the bank read amplifier 100<i> includes a bank read amplification unit 110 and a bank read disable unit 120.

The bank read amplification unit 110 uses the high power voltage HVDD as a pull-up voltage and is enabled in response to an $i^{th}$ bank read amplifier enable signal BRDEN<i> which is activated according to a selection of a memory bank MBANK<i> corresponding to the bank read amplification unit 110. In addition, the bank read amplification unit 110 is driven to differentially amplify bank data BDAT<i> and inverted bank data/BDAT<i> of the memory bank MBANK<i> corresponding to the bank read amplification unit 110 to output read data RDAT<i> and inverted read data/RADT<i>. In this case, when pulling up, the read data RDAT<i> and the inverted read data/RADT<i> of the memory bank MBANK<i> are controlled at the high power voltage HVDD.

In response to the $i^{th}$ bank read amplifier enable signal BRDEN<i> which is deactivated when the memory bank MBANK<i> is not selected, the bank read disable unit 120 controls both the read data RDAT<i> and the inverted read data/RADT<i> of the memory bank MBANK<i> to be deactivated at a ground voltage VSS.

Referring to FIG. 1 again, the first read driver 200<1> is enabled according to a selection of one of the first memory bank MBANK<1> and the second memory bank MBANK<2>.

That is, according to the selection of the first memory bank MBANK<1>, the first read driver 200<1> drives the read data RDAT<1> of the first bank read amplifier 100<1> to provide the read data RDAT<1> as horizontal local data DATH of the horizontal data line LHDAT.

In addition, according to the selection of the second memory bank MBANK<2>, the first read driver 200<1> drives the read data RDAT<2> of the second bank read amplifier 100<2> to provide the read data RDAT<1> as the horizontal local data DATH of the horizontal data line LHDAT.

Figure 3A:
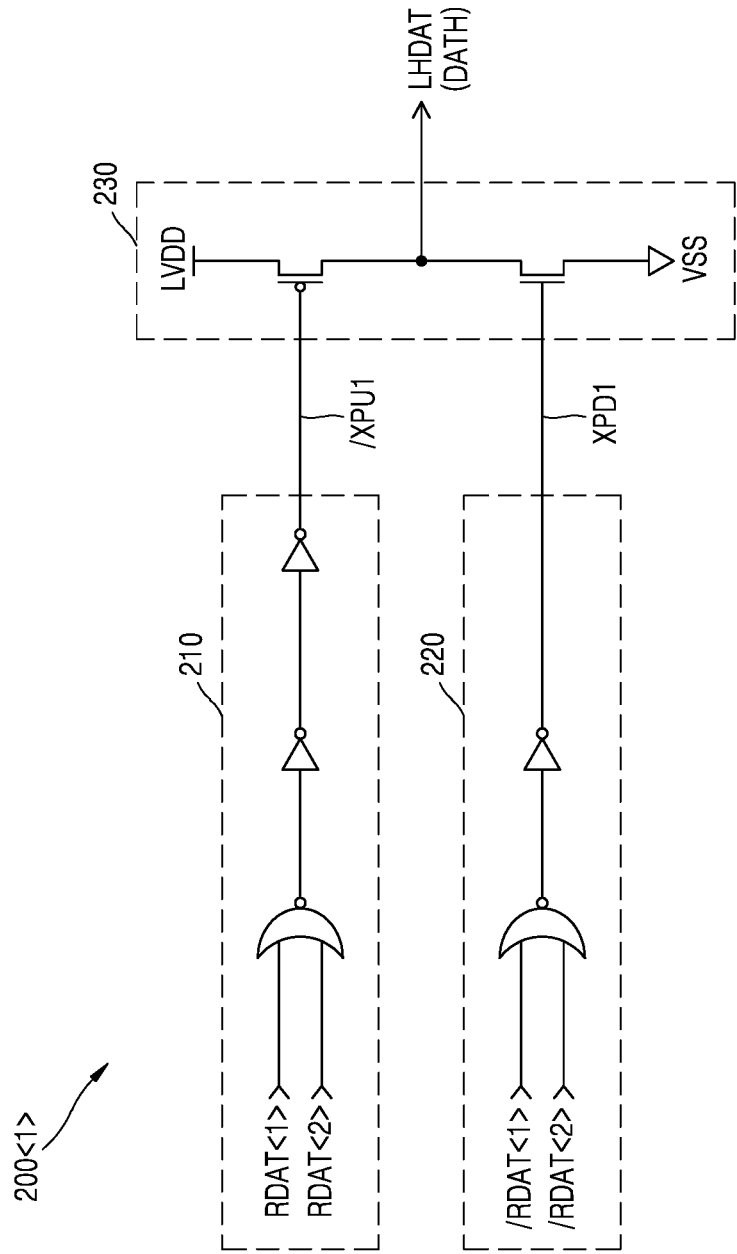
FIG. 3A is a detailed diagram illustrating a first read driver of FIG. 1.

FIG. 3A is a detailed diagram illustrating the first read driver 200<1> of FIG. 1. Referring to FIG. 3A, the first read driver 200<1> includes a first pull-up controller 210, a first pull-down controller 220, and a first read driver 230.

The first pull-up controller 210 receives the read data RDAT<1> of the first bank read amplifier 100<1> and the read data RDAT<2> of the second bank read amplifier 100<2> to generate a first pull-up control signal /XPU1. In this case, according to activation of one of the read data RDAT<1> of the first bank read amplifier 100<1> and the read data RDAT<2> of the second bank read amplifier 100<2> in a logic state of "H," the first pull-up control signal /XPU1 is activated in a logic state of "L."

The first pull-down controller 220 receives inverted read data/RDAT<1> of the first bank read amplifier 100<1> and inverted read data/RDAT<2> of the second bank read amplifier 100<2> to generate a first pull-down control signal XPD1. In this case, according to activation of both the read data RDAT<1> of the first bank read amplifier 100<1> and the read data RDAT<2> of the second bank read amplifier 100<2> in a logic state of "H," the first pull-down control signal XPD1 is deactivated in a logic state of "L."

Here, operations of the first pull-up controller 210 and the first pull-down controller 220 will be described in more detail.

First, it is assumed to be a case in which the first memory bank MBANK<1> is selected. In this case, since the second memory bank MBANK<2> is not redundantly selected with the first memory bank MBANK<1>, the second memory bank MBANK<2> is not selected. Thus, as described above, both the read data RDAT<2> and the inverted read data/RDAT<2> of the second memory bank MBANK<2> are controlled at the ground voltage VSS, that is, the logic state of "L."

Consequently, according to the read data RDAT<1> and the inverted read data /RDAT<1> of the first memory bank MBANK<1>, one of the first pull-up control signal /XPU1 and the first pull-down control signal XPD1 is activated.

Then, it is assumed to be a case in which the second memory bank MBANK<2> is selected. In this case, since the first memory bank MBANK<1> is not redundantly selected with the second memory bank MBANK<2>, the first memory bank MBANK<1> is not selected. Thus, both the read data RDAT<1> and the inverted read data/RDAT<1> of the first memory bank MBANK<1> are controlled at the ground voltage VSS, that is, the logic state of "L."

Consequently, according to the read data RDAT<2> and the inverted read data /RDAT<2> of the second memory bank MBANK<2>, one of the first pull-up control signal /XPU1 and the first pull-down control signal XPD1 is activated.

In response to the activation of the first pull-up control signal /XPU1 in the logic state of "L," the first read driver 230 pulls up the horizontal data line LHDAT at the low power voltage LVDD. In addition, in response to the activation of the first pull-down control signal XPD1 in the logic state of "H," the first read driver 230 pulls down the horizontal data line LHDAT.

In the first read driver 200<1> having the above-described configuration, according to the selection of one of the first and second memory banks MBANK<1> and MBANK<2>, the horizontal local data DATH has a valid value. In this case, when pulling up, the horizontal local data DATH is controlled at the low power voltage LVDD.

When both the first and second memory banks MBANK<1> and MBANK<2> are not selected, both the first pull-up control signal/XPU1 and the first pull-down control signal XPD1 are deactivated. In this case, the horizontal local data DATH depends on the operation of the second read driver 200<2>.

Referring to FIG. 1 again, the second read driver 200<2> is enabled according to a selection of one of the third memory bank MBANK<3> and the fourth memory bank MBANK<4>.

That is, according to the selection of the third memory bank MBANK<3>, the second read driver 200<2> drives the read data RDAT<3> of the third bank read amplifier 100<3> to provide the read data RDAT<3> as the horizontal local data DATH of the horizontal data line LHDAT.

In addition, according to the selection of the fourth memory bank MBANK<4>, the second read driver 200<2> drives the read data RDAT<4> of the fourth bank read amplifier 100<4> to provide the read data RDAT<4> as the horizontal local data DATH of the horizontal data line LHDAT.

Figure 3B:
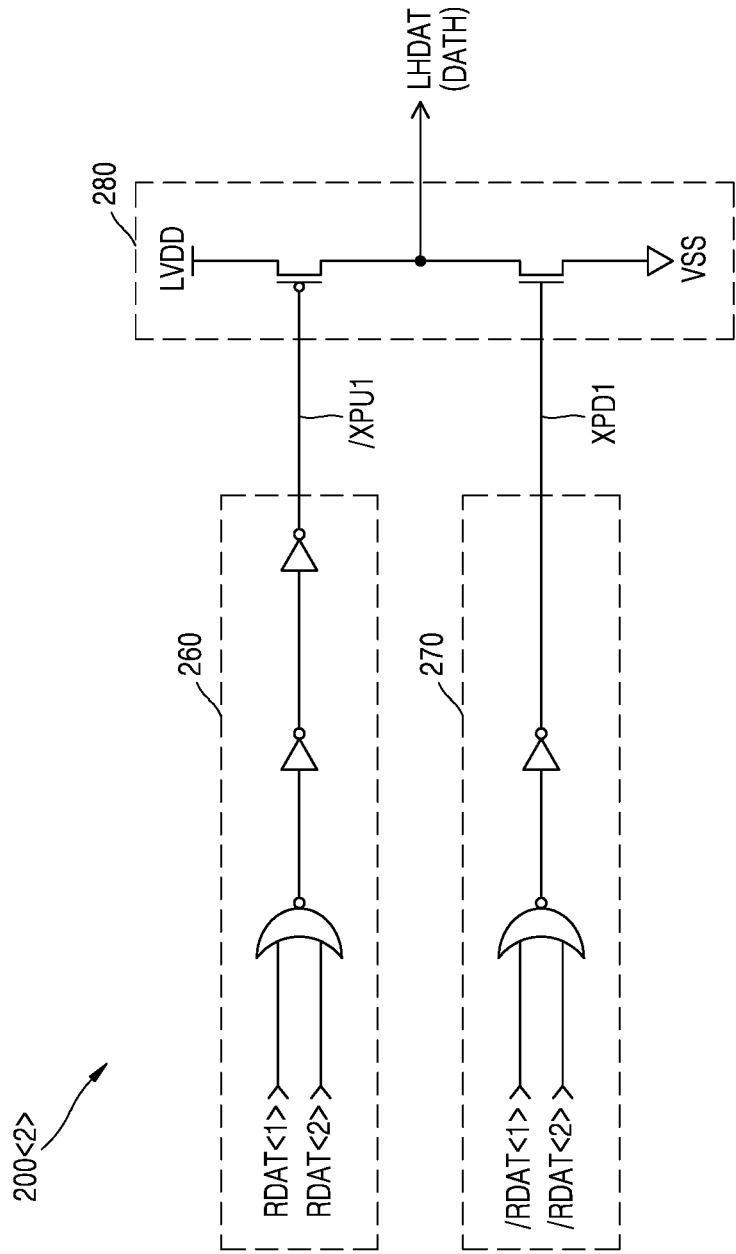
FIG. 3B is a detailed diagram illustrating a second read driver of FIG. 1.

FIG. 3B is a detailed diagram illustrating the second read driver 200<2> of FIG. 1. Referring to FIG. 3B, the second read driver 200<2> includes a second pull-up controller 260, a second pull-down controller 270, and a second read driver 280.

The second pull-up controller 260 receives the read data RDAT<3> of the third bank read amplifier 100<3> and the read data RDAT<4> of the fourth bank read amplifier 100<4> to generate a second pull-up control signal/XPU2. In this case, according to activation of one of the read data RDAT<3> of the third bank read amplifier 100<3> and the read data RDAT<4> of the fourth bank read amplifier 100<4> in a logic state of "H," the second pull-up control signal/XPU2 is activated in a logic state of "L."

The second pull-down controller 270 receives inverted read data/RDAT<3> of the third bank read amplifier 100<3> and inverted read data/RDAT<4> of the fourth bank read amplifier 100<4> to generate a second pull-down control signal XPD2. In this case, according to activation of both the read data RDAT<3> of the third bank read amplifier 100<3> and the read data RDAT<4> of the fourth bank read amplifier 100<4>> in a logic state of "H," the second pull-down control signal XPD2 is deactivated in a logic state of "L."

Here, operations of the second pull-up controller 260 and the second pull-down controller 270 will be described in more detail.

First, it is assumed to be a case in which the third memory bank MBANK<3> is selected. In this case, since the fourth memory bank MBANK<4> is not redundantly selected with the third memory bank MBANK<3>, the fourth memory bank MBANK<4> is not selected. Thus, both the read data RDAT<4> and the inverted read data/RDAT<4> of the fourth memory bank MBANK<4> are controlled at the ground voltage VSS, that is, the logic state of "L."

Consequently, according to the read data RDAT<3> and the inverted read data /RDAT<3> of the third memory bank MBANK<3>, one of the second pull-up control signal /XPU2 and the second pull-down control signal XPD2 is activated.

Then, it is assumed to be a case in which the fourth memory bank MBANK<4> is selected. In this case, since the third memory bank MBANK<3> is not redundantly selected with the fourth memory bank MBANK<4>, the third memory bank MBANK<3> is not selected. Thus, both the read data RDAT<3> and the inverted read data/ RDAT<3> of the inverted read data/RDAT<3> are controlled at the ground voltage VSS, that is, the logic state of "L."

Consequently, according to the read data RDAT<4> and the inverted read data /RDAT<4> of the fourth memory bank MBANK<4>, one of the second pull-up control signal /XPU2 and the second pull-down control signal XPD2 is activated.

In response to the activation of the second pull-up control signal/XPU2 in the logic state of "L," the second read driver 280 pulls up the horizontal data line LHDAT at the low power voltage LVDD. In addition, in response to the activation of the second pull-down control signal XPD2 in the logic state of "H," the second read driver 280 pulls down the horizontal data line LHDAT.

In the second read driver 200<2> having the above-described configuration, according to the selection of one of the third and fourth memory banks MBANK<3> and MBANK<4>, the horizontal local data DATH has a valid value. In this case, when pulling up, the horizontal local data DATH is controlled at the low power voltage LVDD.

When both the third and fourth memory banks MBANK<3> and MBANK<4> are not selected, both the second pull-up control signal/XPU2 and the second pull-down control signal XPD2 are deactivated. In this case, the horizontal local data DATH depends on the operation of the first read driver 200<1>.

Referring to FIG. 1 again, the high impedance 300 is enabled according to a selection of one among the first to fourth memory banks MBANK<1> to MBANK<4>. In this case, the high impedance 300 drives the horizontal local data DATH to output the horizontal local data DATH as vertical local data DATV of the vertical data line LVDAT. Here, when pulling up, the vertical local data DATV is controlled at the low power voltage LVDD.

Figure 4:
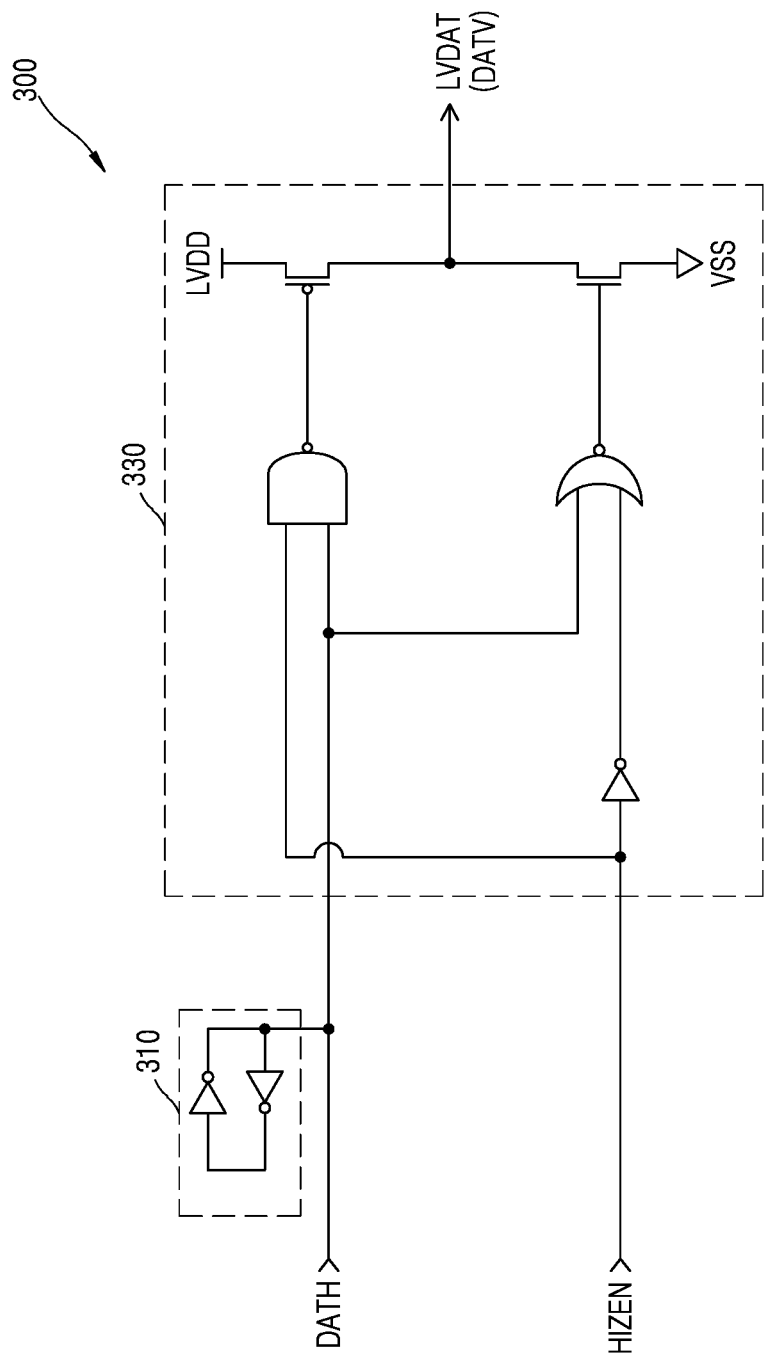
FIG. 4 is a detailed diagram illustrating a high impedance driver of FIG. 1.

FIG. 4 is a detailed diagram illustrating the high impedance 300 of FIG. 1. Referring to FIG. 4, the high impedance 300 specifically includes a horizontal local latch 310 and a high impedance driver 330.

The horizontal local latch 310 latches the horizontal local data DATH that is provided from the first read driver 200<1> or the second read driver 200<2>.

The high impedance driver 330 is enabled in response to a high impedance enable signal HIZEN which is activated in a logic state of "H" according to the selection of one among the first to fourth memory banks MBANK<1> to MBANK<4>.

In this case, the high impedance driver 330 receives the low power voltage LVDD and drives the horizontal local data DATH to output the horizontal local data DATH as the vertical local data DATV of the vertical data line LVDAT. In this case, when pulling up, the horizontal local data DATH is controlled at the low power voltage LVDD.

Referring to FIG. 1 again, the global amplifier 400 amplifies the vertical local data DATV to provide the amplified vertical local data DATV as global data DATG of a global data line GDL. Here, the global data line GDL is electrically connected to the input/output buffer 500. In this case, when pulling up, the global data DATG is controlled at the high power voltage HVDD.

Consequently, the pieces of data output from the semiconductor memory device of the present invention are sufficiently developed so that communication with an external device may be smoothly performed.

Figure 5:
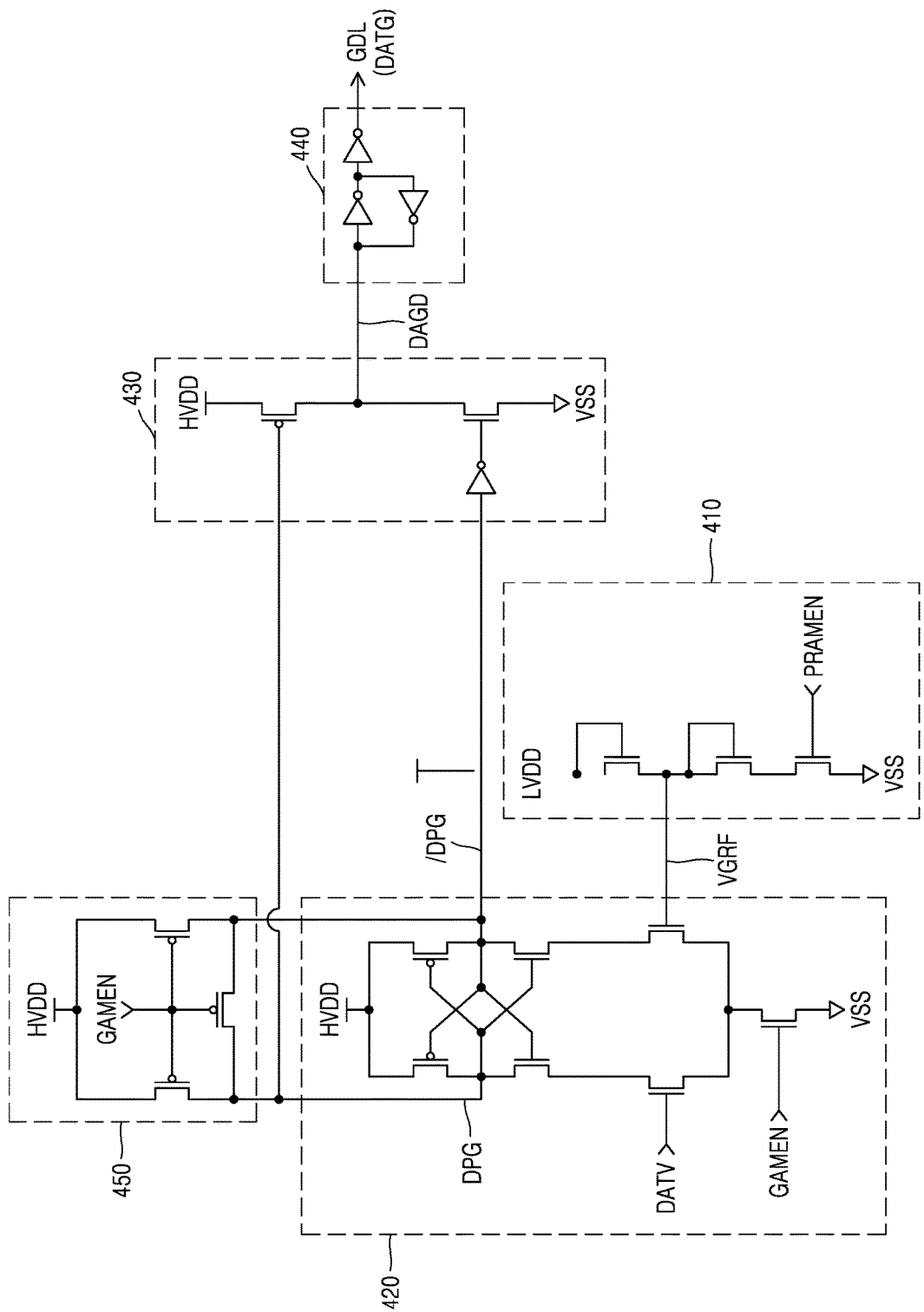
FIG. 5 is a detailed diagram illustrating a global amplifier of FIG. 1.

FIG. 5 is a detailed diagram illustrating the global amplifier 400 of FIG. 1. Referring to FIG. 5, the global amplifier 400 specifically includes a global reference voltage generator 410, a global amplifier 420, a global driver 430, a global repeating part 440, and a global disable part 450.

In response to a preliminary enable signal PRAMEN which is activated in a logic state of "H" during a read operation, the global reference voltage generator 410 is enabled to generate a global reference voltage VGRF.

The global amplifier 420 is enabled in response to a global enable signal GAMEN which is activated in a logic state of "H" during the read operation. In this case, the global amplifier 420 detects and amplifies a voltage level of the vertical local data DATV with respect to the global reference voltage VGRF to generate global preliminary data DPG.

Here, the activation of the global enable signal GAMEN is performed after the activation of the preliminary enable signal PRAMEN occurs.

The global driver 430 generates global driving data DAGD according to the global preliminary data DPG.

The global repeating part 440 latches and amplifies the global driving data DAGD to generate the global driving data DAGD as the global data DATG. In this case, when pulling up, the global data DATG is controlled at the low power voltage LVDD.

In addition, when disabling, the global disable part 450 is driven to control the global preliminary data DPG and inverted data/DPG of the global preliminary data DPG at the high power voltage HVDD. Thus, the global driving data DAGD directly maintains a value which is latched by the global repeating part 440.

As described above, in the semiconductor memory device of the present invention, when pulling up, the bank data BDAT<1> to BDAT<4> of the first to fourth memory banks MBANK<1> to MBANK<4> and the global data DATG are controlled at the high power voltage HVDD. Thus, losses of the pieces of data output from the memory banks MBANK are minimized. In addition, when pulling up, the global data DATG provided to the input/output buffer 500 is also controlled at the high power voltage HVDD so that communication with an external device may be smoothly performed.

Meanwhile, in the semiconductor memory device of the present invention, the data lines between the memory banks MBANK and the input/output buffer 500 are divided into the horizontal data lines LHDAT and the vertical data lines LVDAT. In addition, the high impedance 300 is provided to drive the horizontal local data DATH of the horizontal data line LHDAT to provide the horizontal local data DATH as the vertical local data DATV of the vertical data line LVDAT.

Consequently, as compared with a semiconductor memory device in which the memory banks MBANK and the input/output buffer 500 are connected through one data line, loads of the data lines are significantly reduced in the semiconductor memory device of the present invention.

Therefore, in the semiconductor memory device of the present invention, even when the horizontal local data DATH and the vertical local data DATV are controlled at the low power voltage LVDD, degradation in overall operating speed hardly occurs.

In addition, in the semiconductor memory device of the present invention, when pulling up, the horizontal local data DATH and the vertical local data DATV are controlled at the low power voltage LVDD so that current consumption in the data lines is reduced.

Further, in the semiconductor memory device of the present invention, a structure is implemented such that the first read driver 200<1> is shared by the first memory bank MBANK<1> and the second memory bank MBANK<2>, and the second read driver 200<2> is shared by the third memory bank MBANK<3> and the fourth memory bank MBANK<4>.

Therefore, according to the semiconductor memory device of the present invention, an overall layout area is significantly reduced.

In accordance with a semiconductor memory device according to the present invention, which has the above structure, data lines between each memory bank and an input/output buffer are divided into horizontal data lines and vertical data lines. A high impedance driver is provided to drive horizontal local data of the horizontal data line to provide the horizontal local data as vertical local data of the vertical data line. Therefore, in accordance with the semiconductor memory device according to the present invention, even when the horizontal local data and the vertical local data are controlled at a low power voltage, degradation in overall operating speed hardly occurs. In addition, in accordance with the semiconductor memory device according to the present invention, current consumption in the data lines is significantly reduced.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

What is claimed is:

1. A multi-bank type semiconductor memory device comprising:
    a bank set including a first memory bank, a second memory bank, a third memory bank, and a fourth memory bank, each of which outputs bank data, wherein the second memory bank is disposed below the first memory bank, the third memory bank is disposed on a right side of the first memory bank, and the fourth memory bank is disposed below the third memory bank;
    a horizontal data line extending between the first memory bank and the second memory bank and between the third memory bank and the fourth memory bank in a lateral direction;
    a vertical data line extending between the first memory bank and the third memory bank and between the second memory bank and the fourth memory bank in a vertical direction;
    a first bank read amplifier, a second bank read amplifier, a third bank read amplifier, and a fourth bank read amplifier disposed to correspond to the first to fourth memory banks and configured to amplify pieces of bank data of the first to fourth memory banks to output pieces of read data according to selections of the first to fourth memory banks;
    a first read driver configured to drive the pieces of read data of the first bank read amplifier and the second bank read amplifier to provide the pieces of read data as pieces of horizontal local data of the horizontal data line according to the selection of the first memory bank and the second memory bank;
    a second read driver configured to drive the pieces of read data of the third bank read amplifier and the fourth bank read amplifier to provide the pieces of read data as pieces of horizontal local data of the horizontal data line according to the selection of the third memory bank and the fourth memory bank;
    a high impedance driver configured to drive the horizontal local data to output the horizontal local data as vertical local data of the vertical data line according to the selection of one among the first to fourth memory banks; and
    a global amplifier configured to amplify the vertical local data to provide the amplified vertical local data as global data of a global data line, wherein the global data line is electrically connected to an input/output buffer,
    wherein, when pulling up, the bank data of each of the first to fourth memory banks and the global data are driven at a high power voltage,
    when pulling up, the horizontal local data and the vertical local data are controlled at a low power voltage that is lower than the high power voltage, and
    the high impedance driver includes:
    a horizontal local latch configured to latch the horizontal local data; and
    a high impedance driver configured to drive the horizontal local data to output the horizontal local data as the vertical local data of the vertical data line according to the selection of one among the first to fourth memory banks.

2. The multi-bank type semiconductor memory device of claim 1, wherein each of the first to fourth bank read amplifiers includes:
    a bank read amplification unit enabled according to the selection among the first to fourth memory banks corresponding to the bank read amplification unit and driven to amplify the bank data of the first to fourth memory banks corresponding to the bank data as read data; and
    a bank read disable unit configured to control the read data to be disabled according to non-selection among the first to fourth memory banks corresponding to the bank read disable unit.

3. The multi-bank type semiconductor memory device of claim 1, wherein the global amplifier includes:
    a global reference voltage generator configured to generate a global reference voltage;
    a global amplifier configured to detect and amplify a voltage level of the vertical local data with respect to the global reference voltage to generate the voltage level as global preliminary data;
    a global driver driven according to the global preliminary data to generate global driving data; and
    a global repeating part configured to latch and amplify the global driving data to generate the amplified global driving data as the global data.

4. The multi-bank type semiconductor memory device of claim 3, wherein, when disabling, the global amplifier includes a global disable part configured to control the global preliminary data to maintain the global driving data which is latched by the global repeating part.

* * * * *